US010641835B2

(12) United States Patent
Lee et al.

(10) Patent No.: US 10,641,835 B2
(45) Date of Patent: May 5, 2020

(54) HEALTH MONITORING AND SAFETY PROTECTION FOR LITHIUM ION BATTERY MODULES AND APPLICATIONS

(71) Applicant: ASCENDING ENERGY INC., Ithaca, NY (US)

(72) Inventors: Andrew Pei-Chang Lee, Fort Lee, NJ (US); Chun-Chieh Chang, Ithaca, NY (US)

(73) Assignee: ASCENDING ENERGY INC., Ithaca, NY (US)

( * ) Notice: Subject to any disclaimer, the term of this patent is extended or adjusted under 35 U.S.C. 154(b) by 73 days.

(21) Appl. No.: 15/922,156

(22) Filed: Mar. 15, 2018

(65) Prior Publication Data
US 2019/0285700 A1    Sep. 19, 2019

(51) Int. Cl.
G01R 31/392 (2019.01)
G01R 31/3842 (2019.01)
H01M 10/0525 (2010.01)
H02J 7/00 (2006.01)
H01M 10/052 (2010.01)
H01M 10/48 (2006.01)
H01M 2/34 (2006.01)

(52) U.S. Cl.
CPC ....... G01R 31/392 (2019.01); G01R 31/3842 (2019.01); H01M 2/34 (2013.01); H01M 10/052 (2013.01); H01M 10/0525 (2013.01); H01M 10/48 (2013.01); H02J 7/0019 (2013.01); H02J 7/0026 (2013.01); H02J 7/0031 (2013.01); H02J 7/0036 (2013.01); H01M 2200/00 (2013.01)

(58) Field of Classification Search
CPC . G01R 31/392; G01R 31/3842; H02J 7/0019; H02J 7/0026; H01M 10/0525
USPC .......................................... 320/134
See application file for complete search history.

(56) References Cited

U.S. PATENT DOCUMENTS

| 6,081,207 | A | * | 6/2000 | Batio | G06F 1/1616 341/20 |
| 7,308,894 | B2 | * | 12/2007 | Hickle | A61M 16/01 128/204.23 |
| 7,859,226 | B2 | * | 12/2010 | Nakazawa | H01M 2/34 320/134 |
| 9,071,049 | B2 | * | 6/2015 | Densham | H01M 10/42 |
| 9,356,324 | B2 | * | 5/2016 | Svensson | H01M 10/48 |
| 9,459,323 | B2 | * | 10/2016 | Mukaitani | G01R 31/389 |
| 9,541,432 | B2 | * | 1/2017 | Kertesz | H01M 2/1022 |

(Continued)

FOREIGN PATENT DOCUMENTS

| CN | 102479985 A | 5/2012 |
| EP | 1126535 A2 | 8/2001 |

(Continued)

OTHER PUBLICATIONS

European Search Report for EP 19 27 5028 dated May 31, 2019.

Primary Examiner — M Baye Diao
(74) Attorney, Agent, or Firm — Thomas | Horstemeyer, LLP

(57) ABSTRACT

One embodiment of safety apparatus for a lithium ion battery module comprises a health monitoring component configured to detect degradation of a battery cell within the lithium ion battery module and transmit an output signal; and a safety protection component configured to receive the output signal and at least disable operation of the lithium ion battery module.

26 Claims, 15 Drawing Sheets

(56) References Cited

U.S. PATENT DOCUMENTS

| | | | |
|---|---|---|---|
| 9,583,796 B2* | 2/2017 | Saha | G01L 1/246 |
| 10,274,546 B2* | 4/2019 | Tanabe | G01R 31/3648 |
| 2006/0056142 A1* | 3/2006 | Takahashi | G06F 1/30 |
| | | | 361/679.33 |
| 2010/0134305 A1* | 6/2010 | Lu | H02J 7/0021 |
| | | | 340/636.13 |
| 2010/0203374 A1* | 8/2010 | Kano | H01M 2/1061 |
| | | | 429/100 |
| 2010/0213309 A1* | 8/2010 | Parks | B64C 3/16 |
| | | | 244/46 |
| 2011/0012560 A1* | 1/2011 | Sakakibara | H01M 10/441 |
| | | | 320/118 |
| 2012/0021619 A1* | 1/2012 | Bilbrey | H01R 13/6205 |
| | | | 439/39 |
| 2012/0126991 A1 | 5/2012 | Cassidy | |
| 2013/0338767 A1* | 12/2013 | Mazzocchi | A61F 2/1635 |
| | | | 623/6.22 |
| 2015/0090049 A1* | 4/2015 | Kertesz | H01M 2/1022 |
| | | | 73/861.18 |
| 2016/0133901 A1* | 5/2016 | Li | H01M 2/0237 |
| | | | 429/56 |
| 2017/0077725 A1* | 3/2017 | Wilka | H02J 7/0072 |
| 2017/0219657 A1* | 8/2017 | Vovos | G01R 31/3648 |
| 2017/0324122 A1 | 11/2017 | Poirier et al. | |
| 2019/0267677 A1* | 8/2019 | Kahn | G01B 21/10 |

FOREIGN PATENT DOCUMENTS

| | | |
|---|---|---|
| EP | 1928045 A1 | 6/2008 |
| TW | 200729590 A | 8/2007 |
| TW | 20074007 A | 10/2007 |
| WO | 2006118386 A1 | 11/2006 |
| WO | 2017087807 A1 | 5/2017 |

* cited by examiner

HEALTH MONITORING AND SAFETY PROTECTION FOR LITHIUM ION BATTERY MODULES AND APPLICATIONS

TECHNICAL FIELD

The present disclosure is generally related to the monitoring for and prevention of dangerous conditions related to lithium ion batteries and their related applications.

BACKGROUND

Conventionally, lead acid batteries are used as an energy source for a wide variety of applications, including as a backup energy source for uninterruptible power supply (UPS) systems. Lead acid batteries have a long history due in part to their low cost. However, the usage of lead acid batteries also has its drawbacks, such as the poisonous nature of lead, their low energy density, risk of failure without notice, and their short lifecycles. Such problems have made lead acid batteries unsatisfactory for many applications, including UPS systems. As an alternative, lithium ion batteries have promise in replacing lead acid batteries for many applications. However, lithium ion batteries also are subject to difficulties in determining of the state of health (SOH) of the batteries and consequently the prevention of safety problems related to operation of the batteries, which have made lithium ion batteries undesirable in some applications, especially for large applications, such as a bulky UPS system (e.g. 800 kVA, 500V UPS system). Accordingly, lithium ion batteries are viable replacements for lead acid batteries in many of today's applications if safety concerns can be addressed and improved.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

In accordance with the present disclosure, embodiments of an apparatus, method, and system for monitoring a state of health and enabling a safety protection activity with respect to a lithium ion battery are disclosed. Accordingly, such a safety protection activity may be enacted by the disclosed apparatuses, methods, and systems to prevent one or more lithium ion batteries from rupturing or igniting (e.g. under thermal runaway conditions).

While safety problems are a major concern for lithium ion batteries, conventional lithium ion batteries generally utilize diagnostic electronics in an attempt to keep the batteries in safe operations. Accordingly, the determinations of over voltage (over charging), under voltage (over discharging), over current, and over temperature are the types of diagnostic tests that are performed by conventional diagnostic electronic equipment. However, there are chances for the diagnostic electronic equipment itself to fail or partially fail over years of operation (in additional to the lithium ion batteries) which is a major risk in using conventional lithium ion batteries as a power source.

In accordance with the present disclosure, systems, apparatuses, and methods of embodiments for monitoring a state of health and enabling safety protection measures or activities of a lithium ion battery module are described. Such a mechanism can be extended to various lithium ion battery modules, including Lithium Ferrous Phosphorous Oxide (LFPO) batteries, Lithium Iron Phosphate (LFP) batteries, Lithium Nickel Manganese Cobalt (NMC) batteries, Lithium Nickel Cobalt Aluminum (NCA) batteries, Lithium Cobalt Oxide (LCO) batteries, etc. For brevity, LFPO battery and LFPO battery modules are used for explaining the present disclosure. One of ordinary skill in the art will appreciate that the technology disclosed herein is not limited to the use of LFPO batteries only and applies to lithium ion batteries in general.

With respect to LFPO battery modules, they have been demonstrated to be superior in many ways to existing lead acid battery systems. For example, the use and advantages of Lithium Ferrous Phosphorous Oxide (LFPO) as cathode material has been previously described in U.S. Pat. Nos. 7,494,744, 7,585,593, 7,629,084, and 7,718,320, which are all incorporated herein by reference; the use and advantages of LFPO in battery balancing systems has been previously described in U.S. Pat. Nos. 7,782,013, 7,808,207, 7,825,632, which are all incorporated herein by reference, and the use and advantages of LFPO as related to battery system controls/operations has been previously described in U.S. Pat. Nos. 7,777,451, 8,217,625, 7,821,231, and 8,159,191, which are all incorporated herein by reference.

Figure 1A:
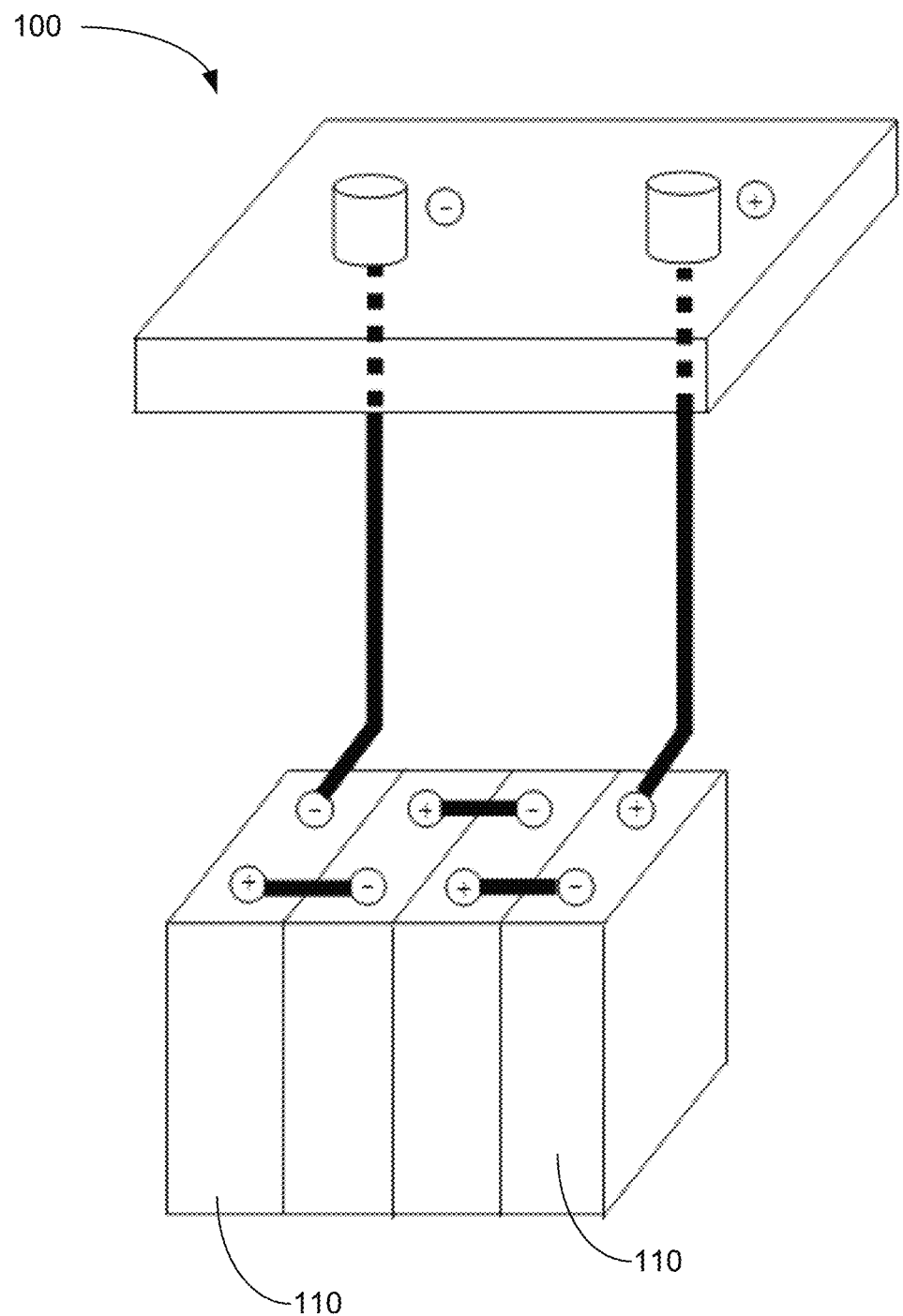
FIGS. 1(a)-1(d) are diagrams of a lithium ion battery module showing the effects of expansion of a battery cell due to cell degradation.

To begin, FIG. 1(a) shows a lithium ion battery module 100 that contains four lithium ion battery (e.g., LFPO) cells 110 in series (e.g., having an open circuit voltage OCV=13.2V). As is a risk with lithium ion batteries, when a lithium ion battery cell 110 is over charged over time, the battery cell volume 110 expands owing to the electrolyte decomposition that increases the internal cell pressure. Although the battery cell 110 may still function with increased internal cell pressure, performance will tend to degrade faster owing to the deficiency of electrolyte materials (caused by cell expansion).

Figure 1B:
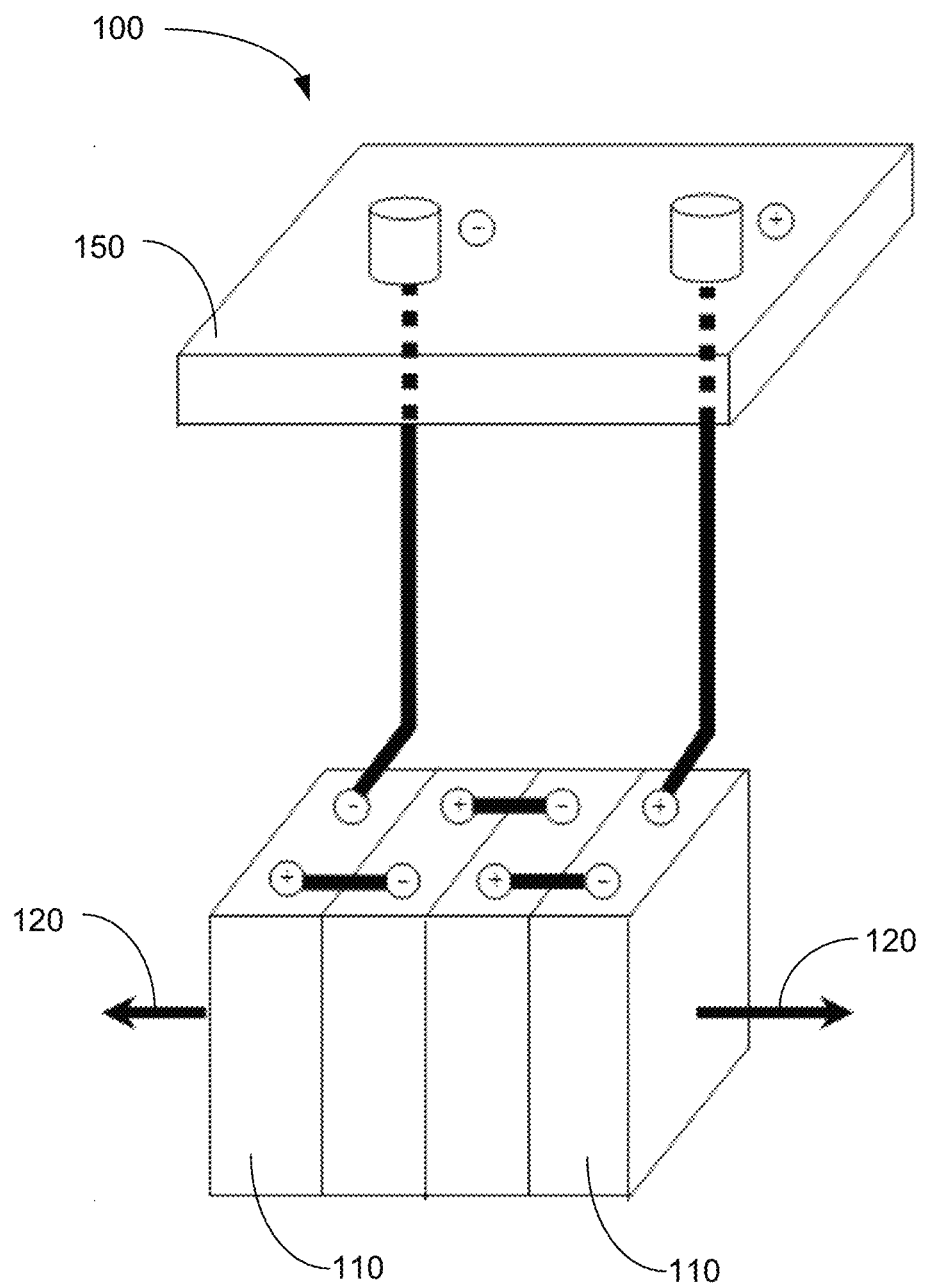
Figure 1C:
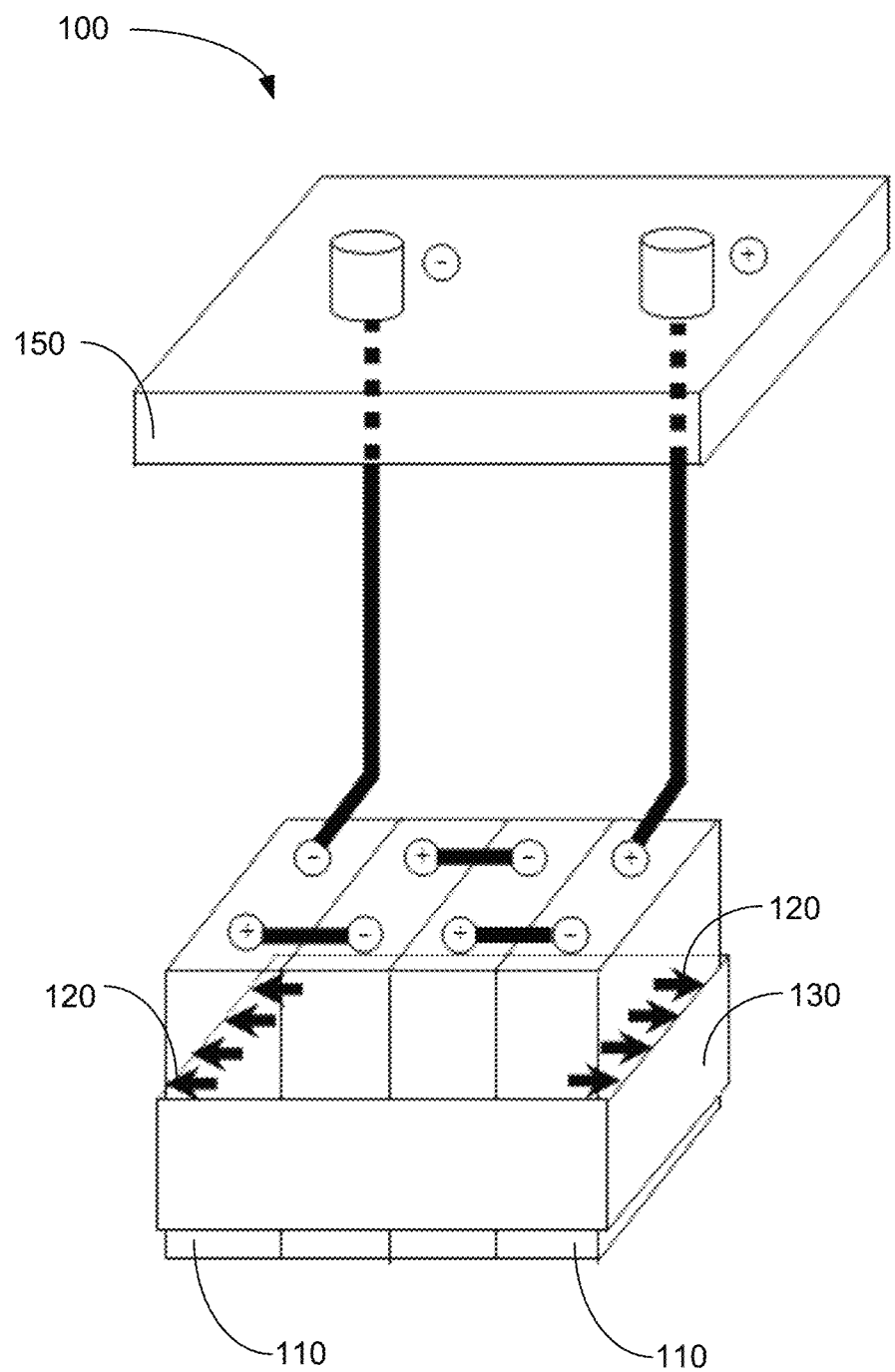
Figure 1D:
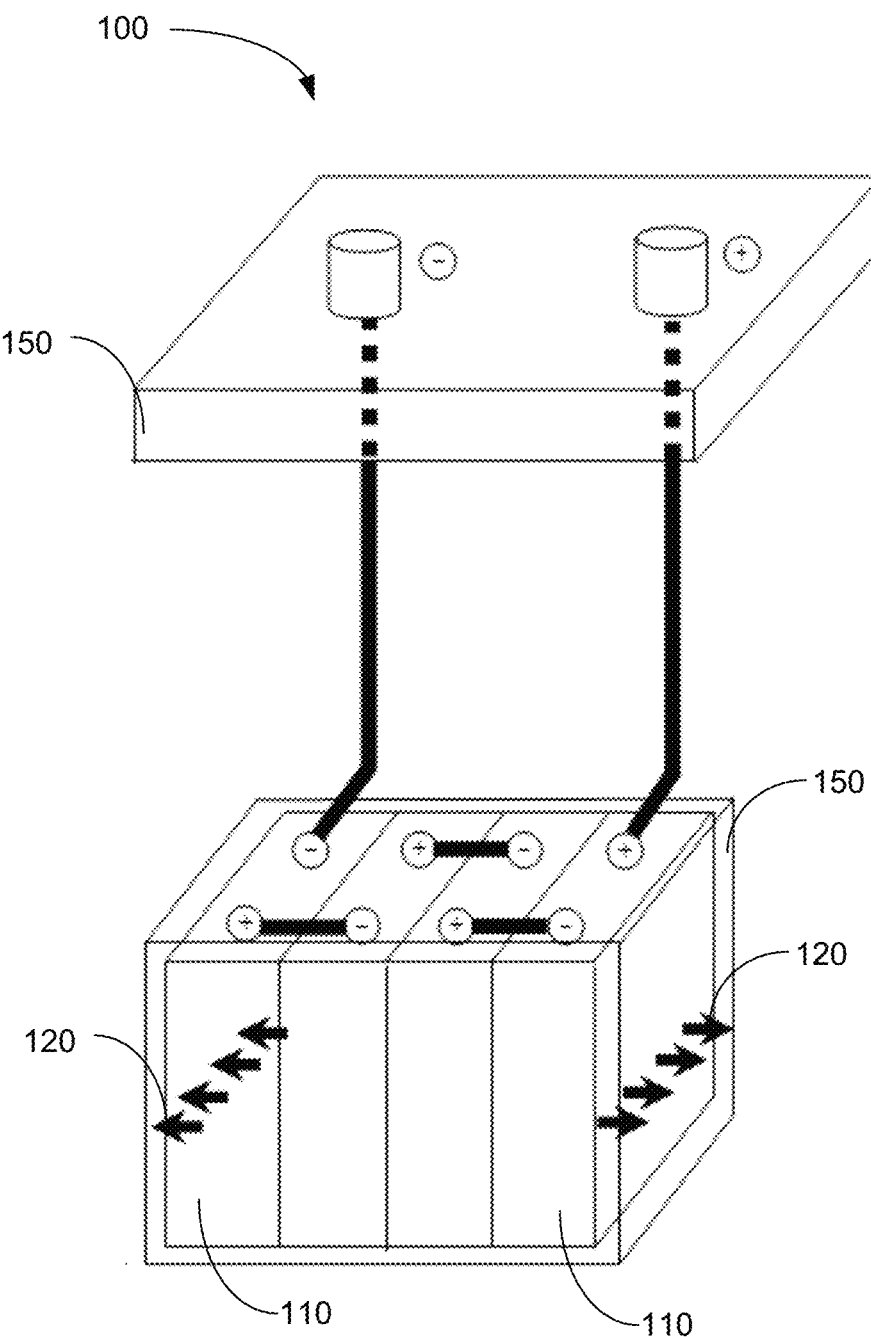

For example, as shown in FIG. 1(b), the battery cell 110 can start to expand laterally (as represented by the arrows 120) when the battery module 100 is overcharged. Alternatively, the battery cell 110 can exert static stress to a hoop or band 130 that bundles the battery cells 110 together within the battery module 100, as shown in FIG. 1(c), or can exert static stress to the outer case 150 of the battery module 100 directly, as shown in FIG. 1(d).

Therefore, embodiments of the present disclosure provide improved techniques for monitoring a state of health and enabling safety protection measures for a lithium ion battery module 100. As such, embodiments of the present disclosure comprises a health monitoring component along with a safety protection component. For example, the health monitoring component monitors and detects changes in battery cell shape or dimension which would occur during a process of battery cell degradation.

In one embodiment, the health monitoring component detects a change in a physical volume of a battery cell. In the foregoing and following discussions, the LFPO battery module is assumed to contain four battery cells connected in series as a stack of battery cells. However, it should be noted that the battery module does not have to contain four cells and further that the battery modules themselves may be connected in series to form a complex battery system that is appropriate for a variety of applications with different system voltage requirements, such as UPS systems.

Figure 2:
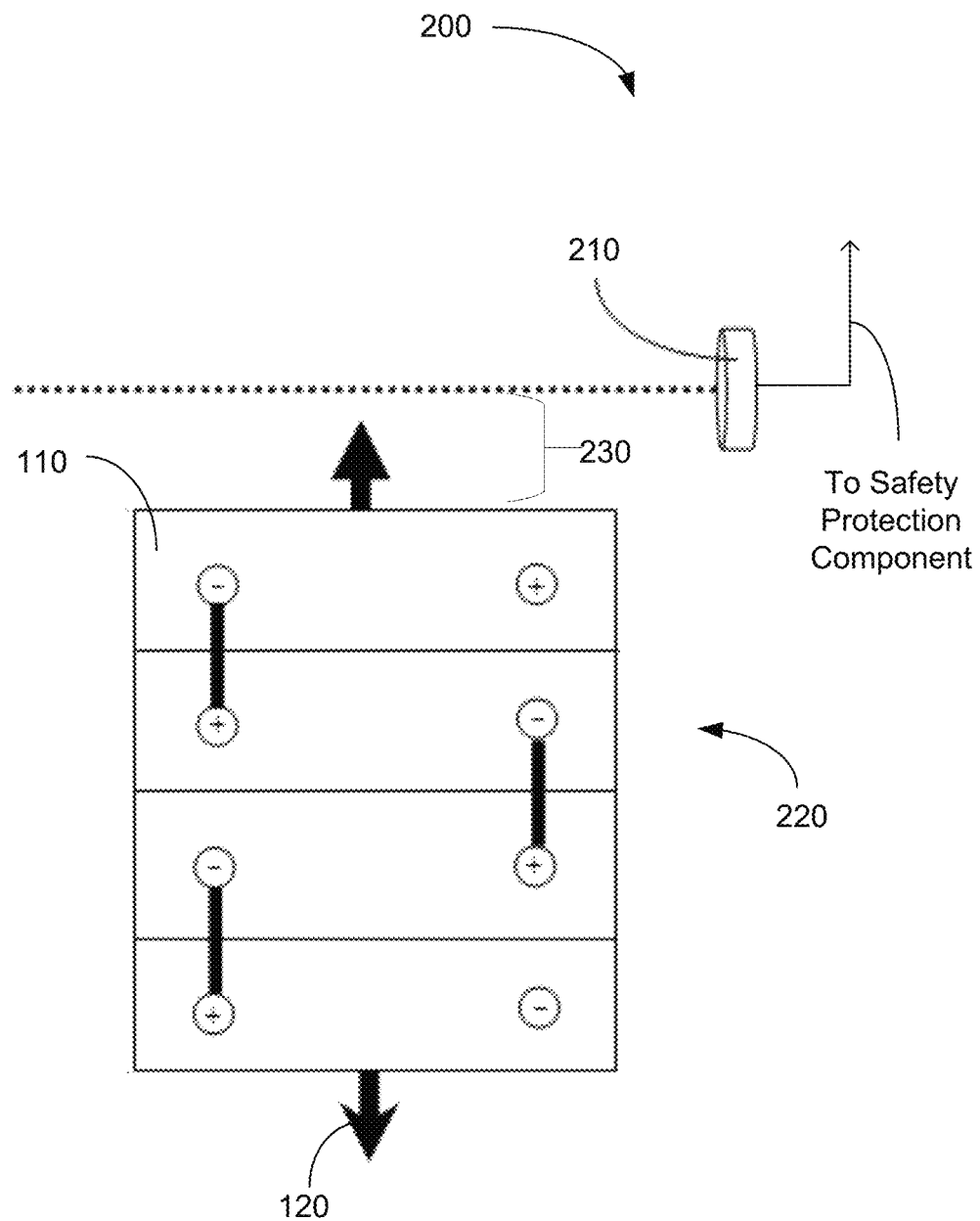
FIG. 2 is a diagram of a health monitoring component for a lithium ion battery module that utilizes an infrared sensor in accordance with embodiments of the present disclosure.

Referring to FIG. 2, one embodiment of the health monitoring component 200 utilizes an infrared sensor 210 that is configured to measure displacement or proximity of an edge of a battery cell 110. In the figure, the infrared sensor 210 is positioned above and orthogonal to stacked battery cells with a gap 230 separating the position of the sensor 210 to the edge of the stack 220 (e.g., the gap can be from millimeters to multiple centimeters). Accordingly, when a battery cell 110 expands due to cell degradation, the edge of the battery stack 220 may move within range of an infrared detection path of the sensor 210 and be capable of detection. The infrared sensor 210 may then output a signal indicating detection of the edge of a battery cell 110 in the infrared detection path. Such a signal may be output to the safety protection component, in accordance with embodiments of the present disclosure, as discussed later in this disclosure.

Figure 3A:
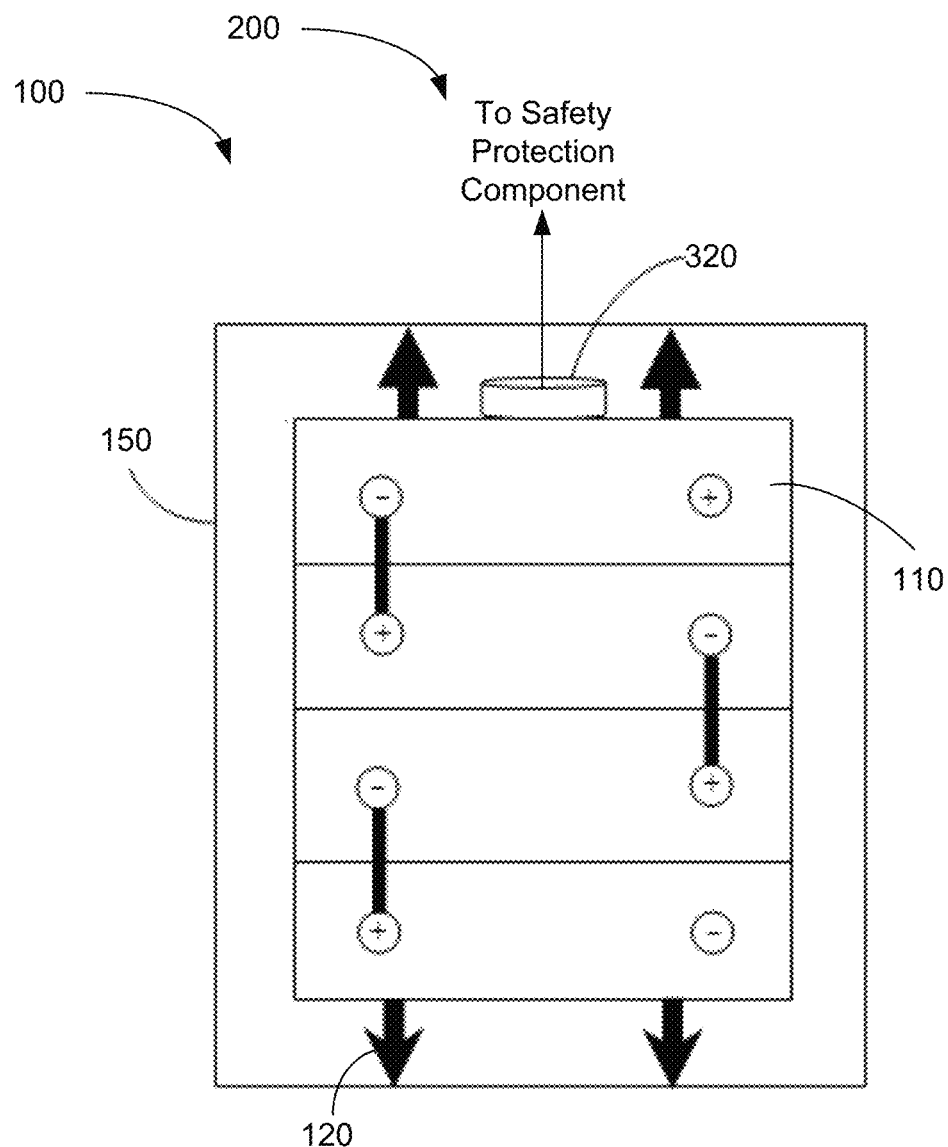
FIGS. 3(a)-3(b) are diagrams of a health monitoring component for a lithium ion battery module that utilizes a pressure sensitive sensor in accordance with embodiments of the present disclosure.
Figure 3B:
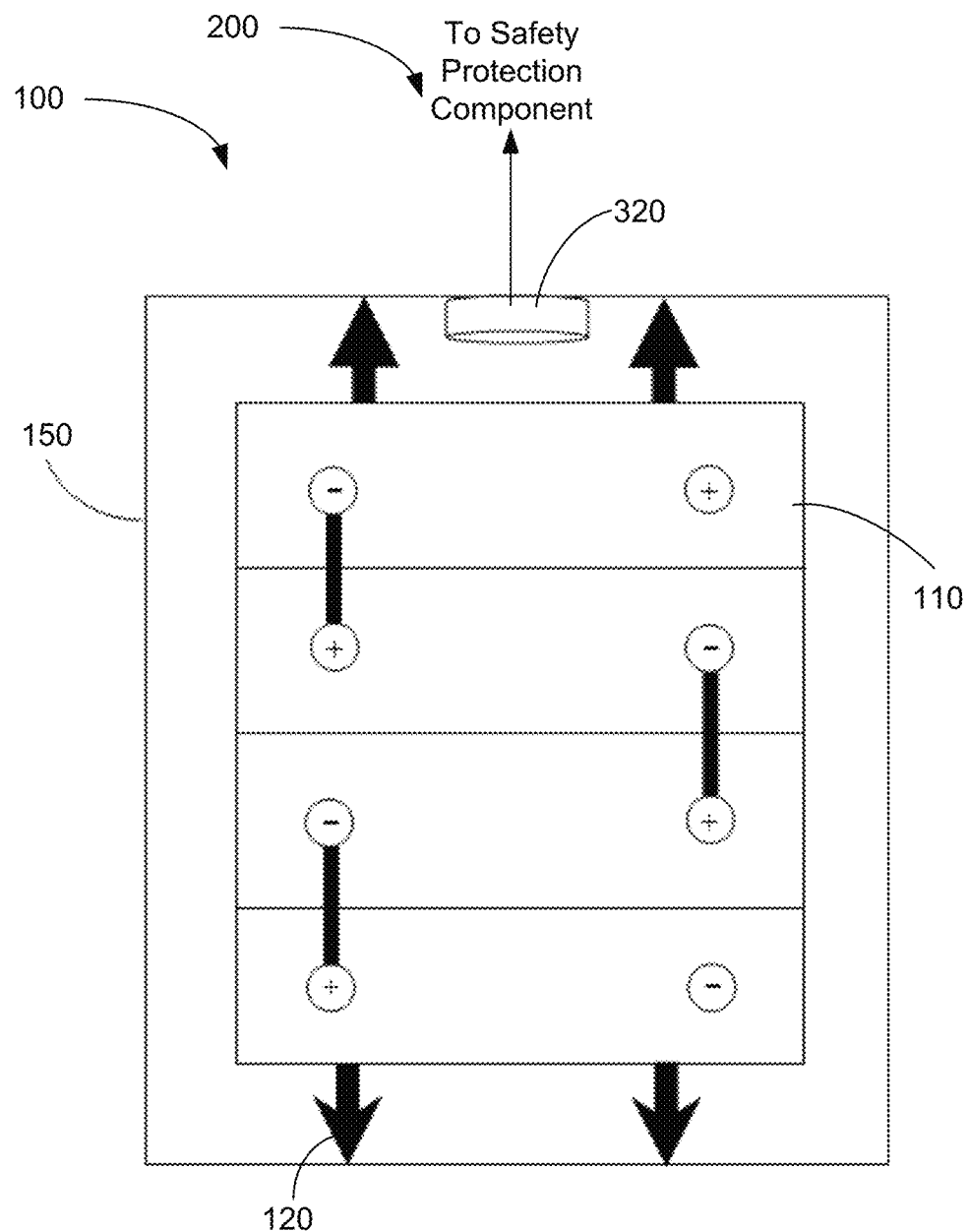

Referring to FIGS. 3(a) and 3(b), additional embodiments of a health monitoring component 200 are depicted which utilize a pressure sensitive sensor 320 to detect a change in pressure within a case 150 of the battery module 100. For example, when a battery cell 110 expands during cell degradation, the battery cell 110 can exert static stress (in the form of a pressure change) to a case 150 that encloses the battery cells together. As shown in FIG. 3(a), a pressure sensitive sensor 320 (e.g. a Piezoelectric sensor) is attached on a top of the battery cell 110 or stack of battery cells. Accordingly, the pressure sensitive sensor 320 can detect a change in pressure within the case of the battery module due to expansion of a battery cell 110. Alternatively, the pressure sensitive sensor 320 can be placed on the outer case 150 directly, as shown in FIG. 3(b). In additional embodiments, the pressure sensitive sensor 320 can be placed on a hoop or band 130 bundling multiple battery cells 110.

Therefore, when a battery cell 110 or stack expands, pressure can be built up between the battery cell 110 and the outer case 150 that triggers the pressure sensitive sensor 320. The pressure sensitive sensor 320 may then output a signal indicating detection of a change in pressure within the battery module 100. Such a signal may be output to the safety protection component, in accordance with embodiments of the present disclosure, as discussed later in this disclosure.

Figure 4A:
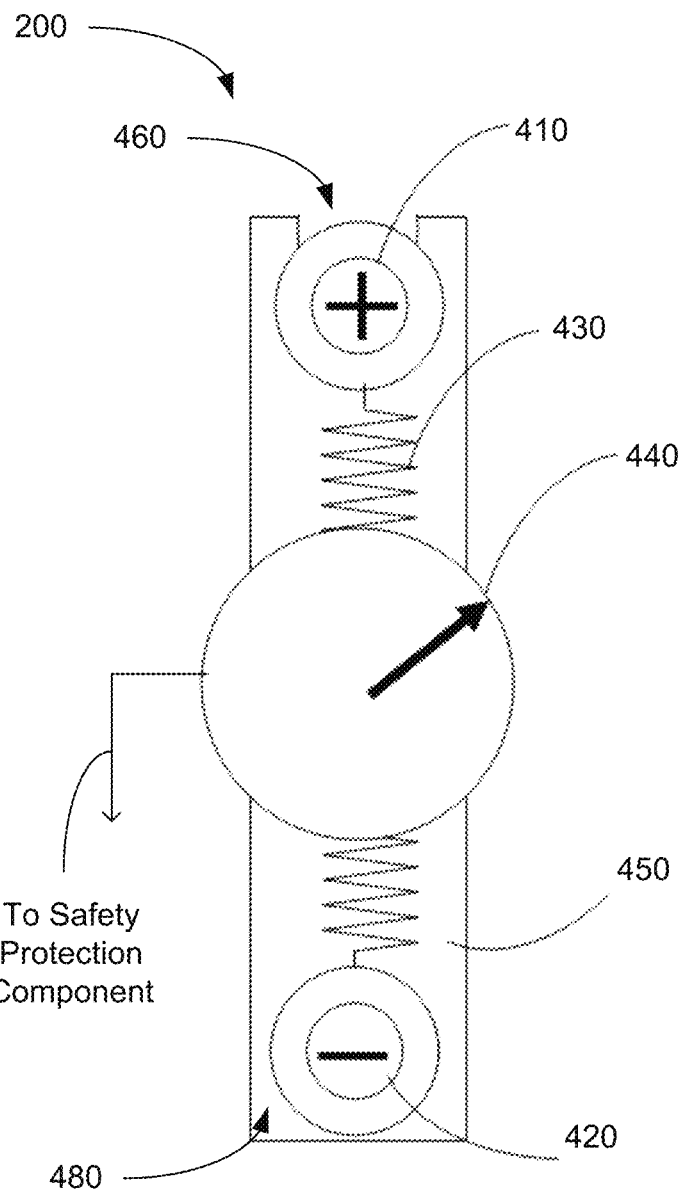
FIGS. 4(a)-4(c) are diagrams of a health monitoring component for a lithium ion battery module that utilizes a force sensor and/or cell terminal collector plate in accordance with embodiments of the present disclosure.
Figure 4B:
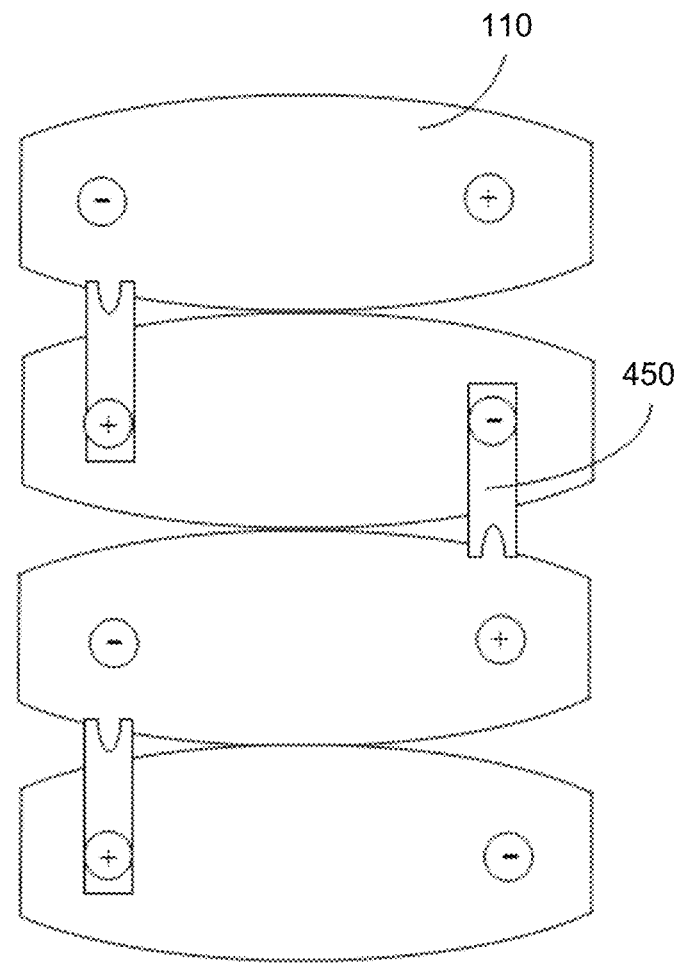
Figure 4C:
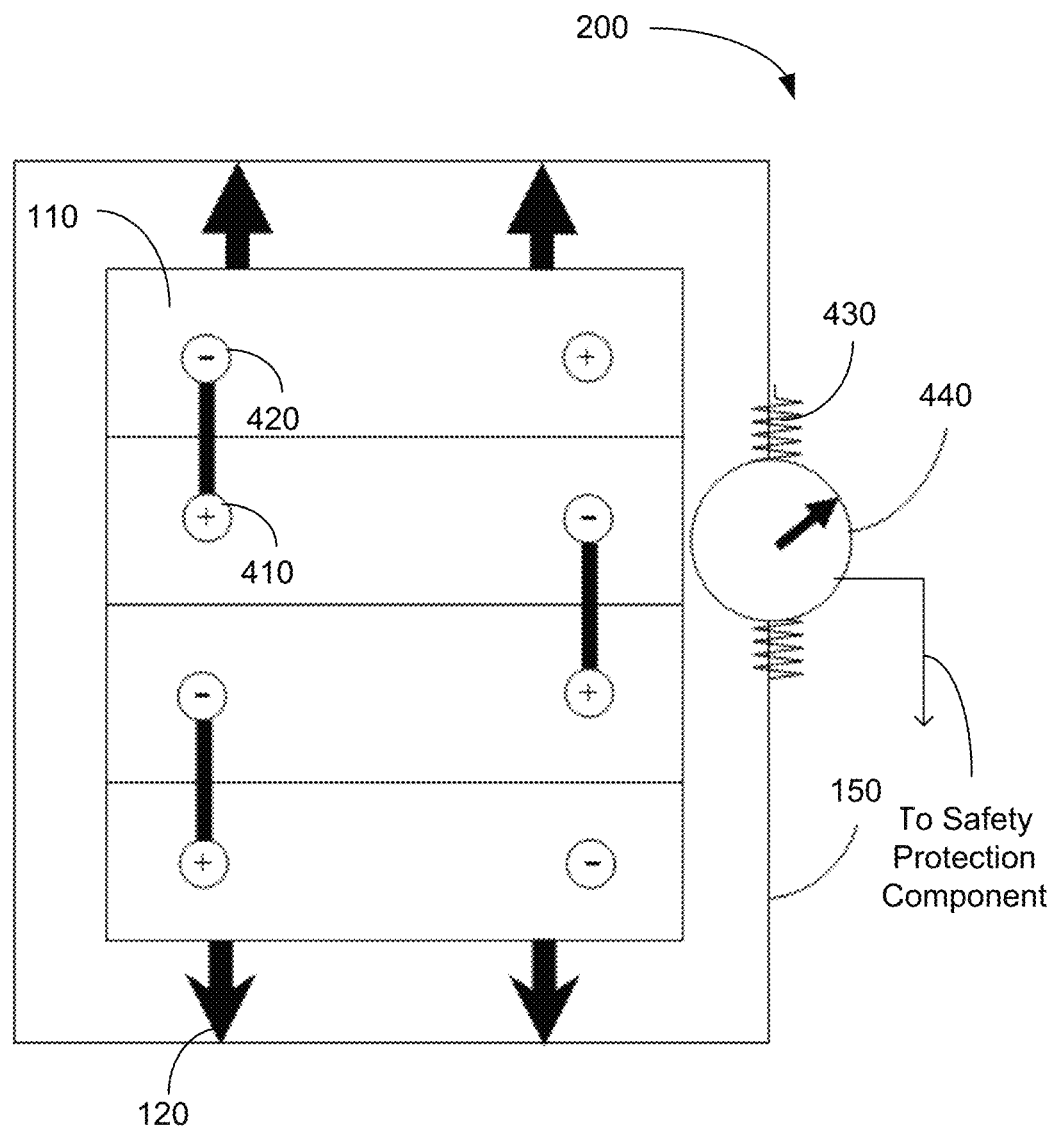

Referring next to FIGS. 4(a)-4(c), one embodiment of the health monitoring component 200 is configured to measure an amount of external force exerted on battery cell terminals 410, 420 or the hoop/band 130 that bundles the battery cells 110 during cell degradation. In FIG. 4(a), one embodiment of the component includes a spring 430 and a force sensor 440 disposed on top of a cell terminal collector plate 450 having one open end 460 and one closed end 480. In the figure, the open end is connected to a terminal 410 of a first battery cell (e.g., positive terminal) and the other closed end is connected to a terminal 420 of a second battery cell (e.g., negative terminal) connected in series with the first battery cell. Further, the cell terminal collector plate 450 is made from a conductive material, such as metal.

When a battery cell 110 expands, such as the deformed cells in FIG. 4(b), the cell terminal connector plates 450 can be disconnected owing to the extra displacement caused by cell expansion, whereas during a normal operation without cell expansion, the open end 460 of the cell terminal connector plate 450 would be connected to their adjacent cell terminals, as shown in FIG. 4(a).

In FIG. 4(a), when a battery cell 110 expands, the expansion force exerted on the cell terminals 410, 420 will cause the spring 430 to be stretched and the force sensor 440 can then detect and measure the displacement of the spring 430. When a displacement limit or threshold is reached or exceeded, the force sensor 440 is configured to output a signal indicating detection of a change in force (exerted on the spring) to a safety protection component.

In various embodiments, the force sensor and spring elements used to detect an applied force and generate an output signal may be in the form of a force transducer circuit element. A similar type of apparatus (force sensor and spring elements) can also be placed on the enclosure 150 that bundles the battery cells 110, as shown in FIG. 4(c), and be used to measure a displacement of one or more springs 430 due to an applied force 120 attributed to expansion of the battery cell 110 or battery stack (as indicated by the arrows).

Figure 5:
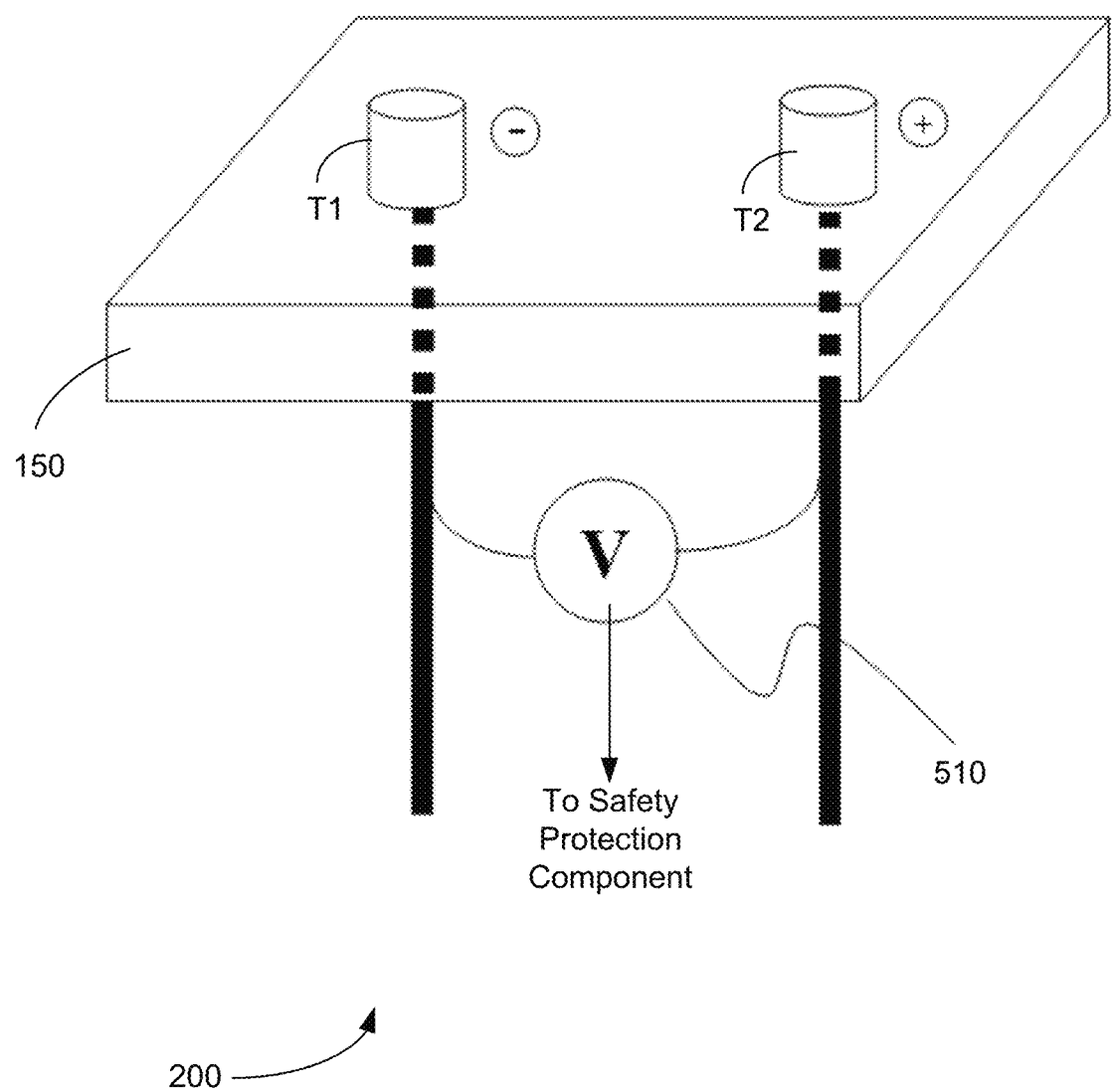
FIGS. 5 and 6 are diagrams of a health monitoring component for a lithium ion battery module that utilizes a voltage sensor to detect a lost contact condition in accordance with embodiments of the present disclosure.

Referring next to FIG. 5, one additional embodiment of the health monitoring component 200 utilizes a voltage sensor 510 to detect a lost contact condition resulting in a change in voltage measurements between lid terminals T1, T2 of an external case 150 of the battery module 100. Accordingly, the voltage sensor 510 can be placed between the lid terminals T1, T2 of the battery module 100. Therefore, when a battery cell 110 expands due to cell degradation causing a lost contact condition (as discussed below), the voltage sensor 510 can output a signal indicating detection of a lost contact condition to a safety protection component.

Figure 6:
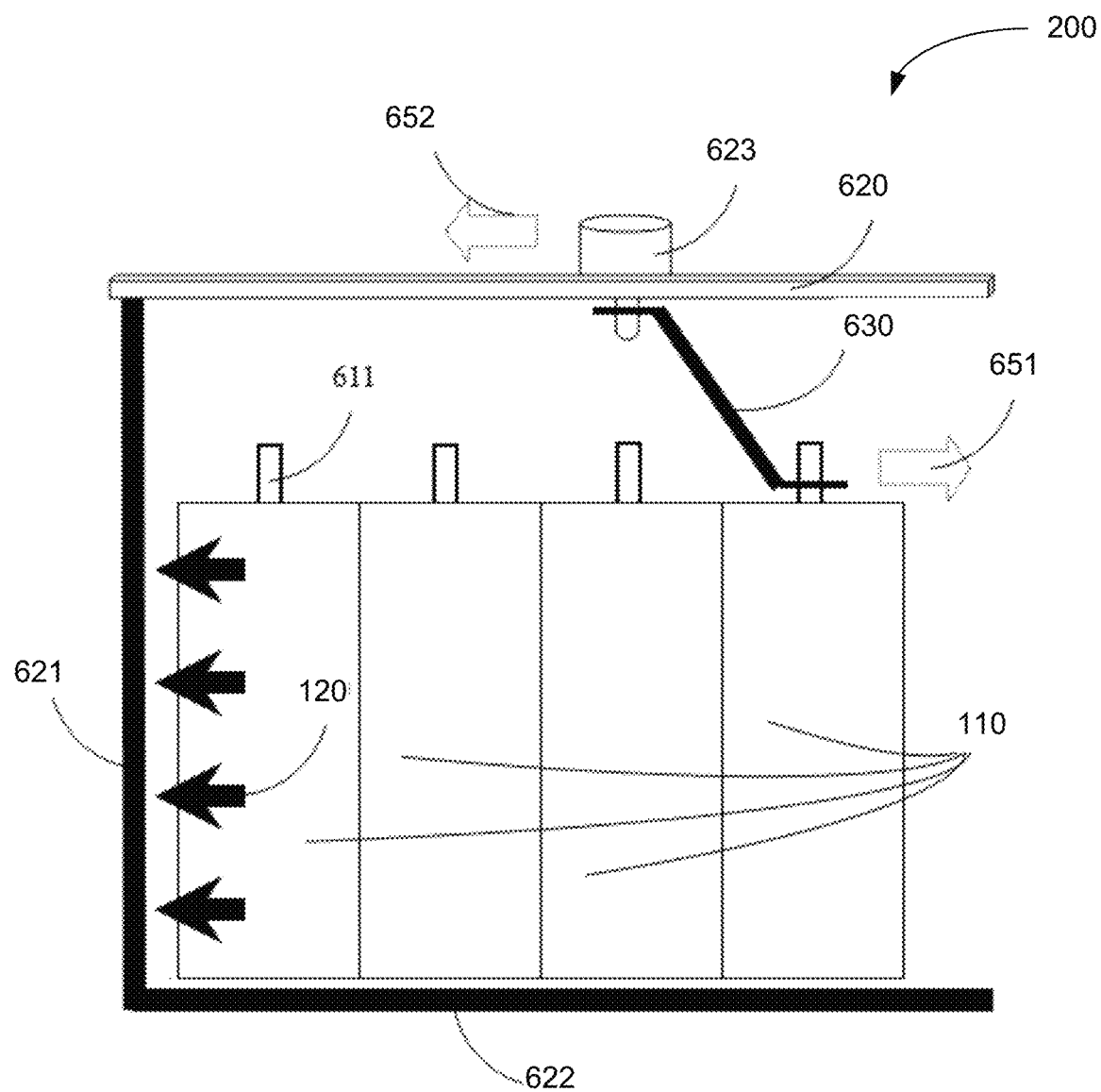

For the lost contact condition to occur, one embodiment of the health monitoring component 200 further comprises a terminal cable 630 having open ends (or at least one open end) that is configured to physically disconnect from a top lid terminal 623 and a terminal 611 of an individual cell 110 of the battery module 100 due to cell expansion, thereby causing a lost contact condition, also referred as an open circuit condition. For example, referring to FIG. 6, when a battery cell expands (owing to the expansion force 120 acting on a rear wall 621 of the battery module case 150), terminal cable(s) 630 connecting a battery cell 110 and a top lid 620 of the battery module case 150 can be disconnected owing to the displacement forces operating in opposite directions (indicated as arrows 651, 652) caused by cell expansion. In the figure, it is noted that the directions of movement of the top lid 620 and the cell expansion are opposite for enhancing the magnitude of displacement. Similarly, in some embodiments, when a battery cell 110 expands, the cell terminal connector plates 450 (described in FIG. 4(b)) can also be disconnected owing to the extra displacement caused by cell expansion. As discussed, the direct disconnection of the electrical contact by the deformed cells will result in an open circuit condition, thus allowing the voltage sensor 510 to detect a change in voltage and output a signal to the safety protection component. Alternatively, instead of using the voltage sensor 510 to transmit an output signal to the safety protection component 700 to indicate a problem with the battery module 100, an external system, such as a backup power system 710 (FIG. 10) that is being used to charge the battery module 100 may identify the problem itself by detecting a float charging current being supplied to the battery module dropping down to zero due to the open circuit condition. Accordingly, the external system may then trigger a local alarm to indicate a problem exists with the one or more of the external system and the battery module 100.

In the embodiments above, an output signal is disclosed as being output to a safety protection component of the disclosed system for monitoring a state of health and enabling a safety protection activity with respect to a lithium ion battery module 100. For example, one embodiment of the safety protection component 700a comprises a relay element 710 that is configured to electrically disconnect an electrical path between a top lid terminal T and a terminal 720 of an individual cell of the battery module 100 responsive to receiving an output signal 740 from the health monitoring component 200, thereby causing disconnection of the battery cells 110 to the lid terminal T of the battery module 100, also referred as an open circuit condition. For example, the relay element 710 can be triggered (e.g. opened) to create an open circuit condition causing a loss of electrical contact between the terminals T of the battery module 100 and the battery cells 110.

Figure 7A:
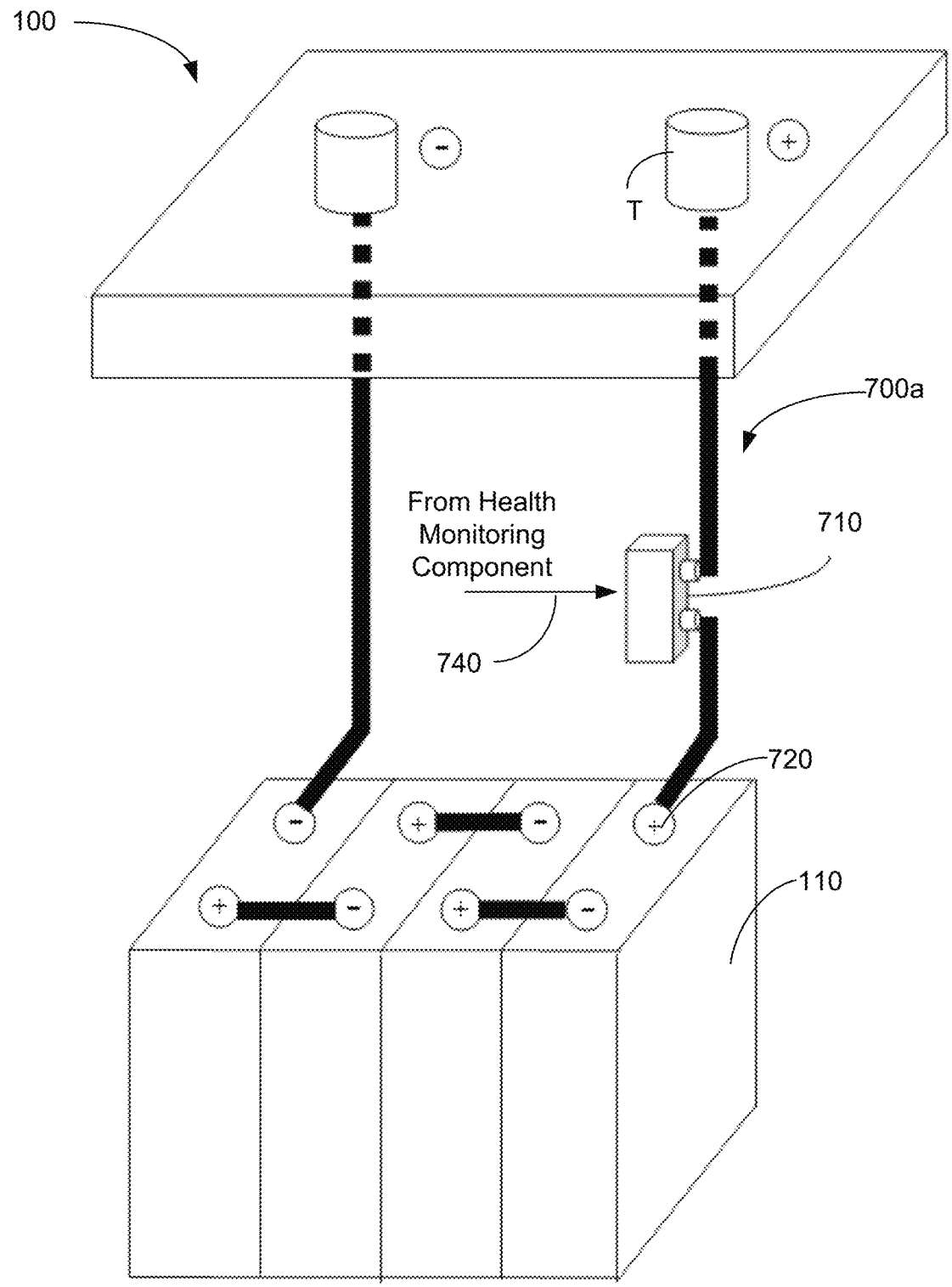
FIGS. 7(a)-7(b) are diagrams of a safety protection component of a lithium ion battery module that is configured to electrically disconnect terminals of the lithium ion battery module in accordance with embodiments of the present disclosure.
Figure 7B:
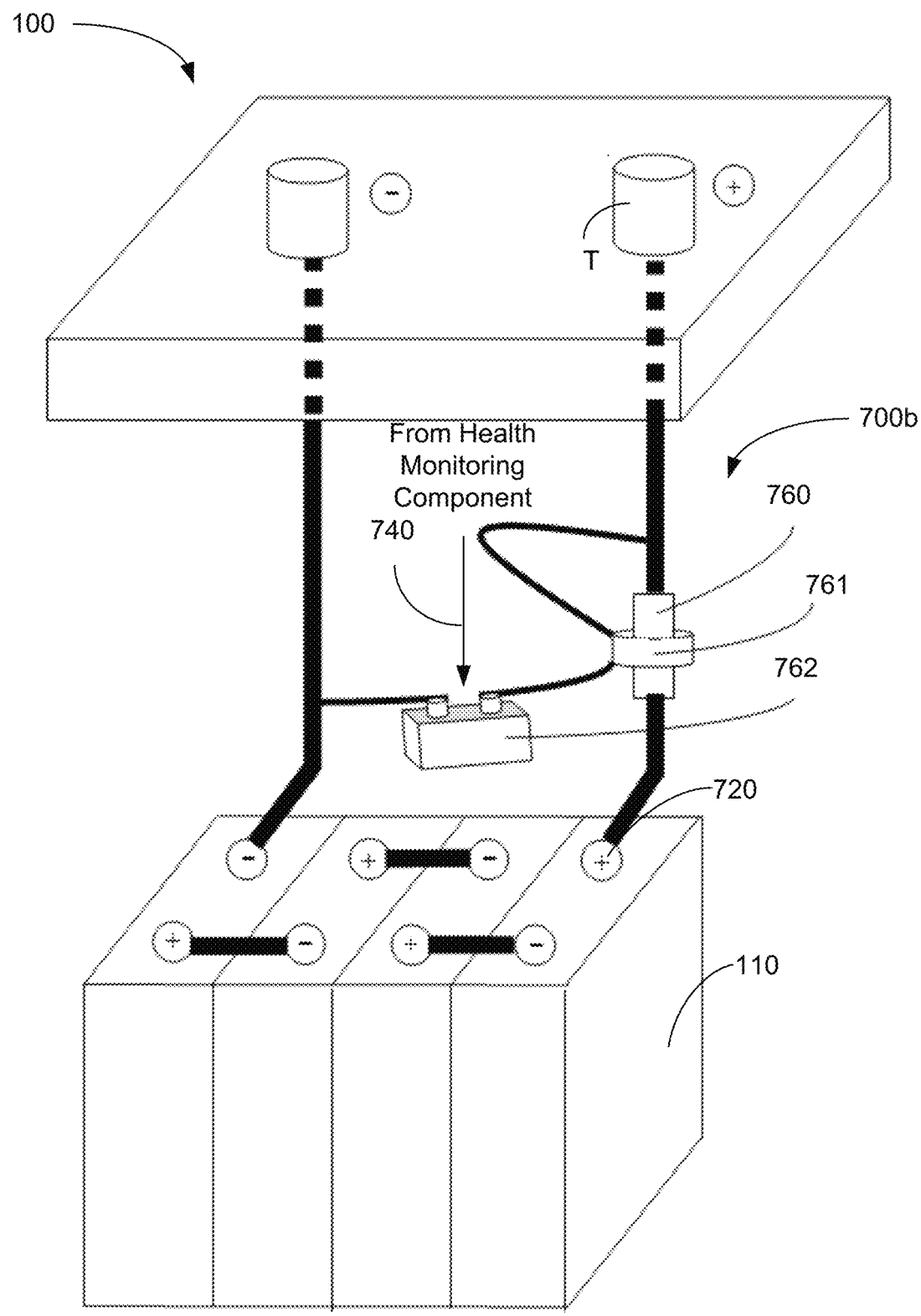

In other embodiments, the relay element can be replaced by a substitute element having a block of metal exhibiting low melting temperature (e.g. tin, aluminum, or other alloys). FIG. 7(b) shows such a safety protection component 700b that is designed for melting a block of low melting point metal that could result in the loss of electrical contact causing disconnection of the battery cells 110 to the lid terminal T of the battery module 100. In FIG. 7(b), a heating element 761 can be deployed surrounding the low melting temperature metal material 760. The heating element 761 is activated when a relay element 762 is triggered to a closed state responsive to receipt of the output signal 740 from the health monitoring component 200 that allows the battery energy to heat up the heating element 761. When the low melting temperature material 760 is melted, the battery cell 110 will be disconnected from the lid terminal T resulting in the loss of electrical contact between the terminal T of the battery module 100 and the battery cell 110.

Figure 8:
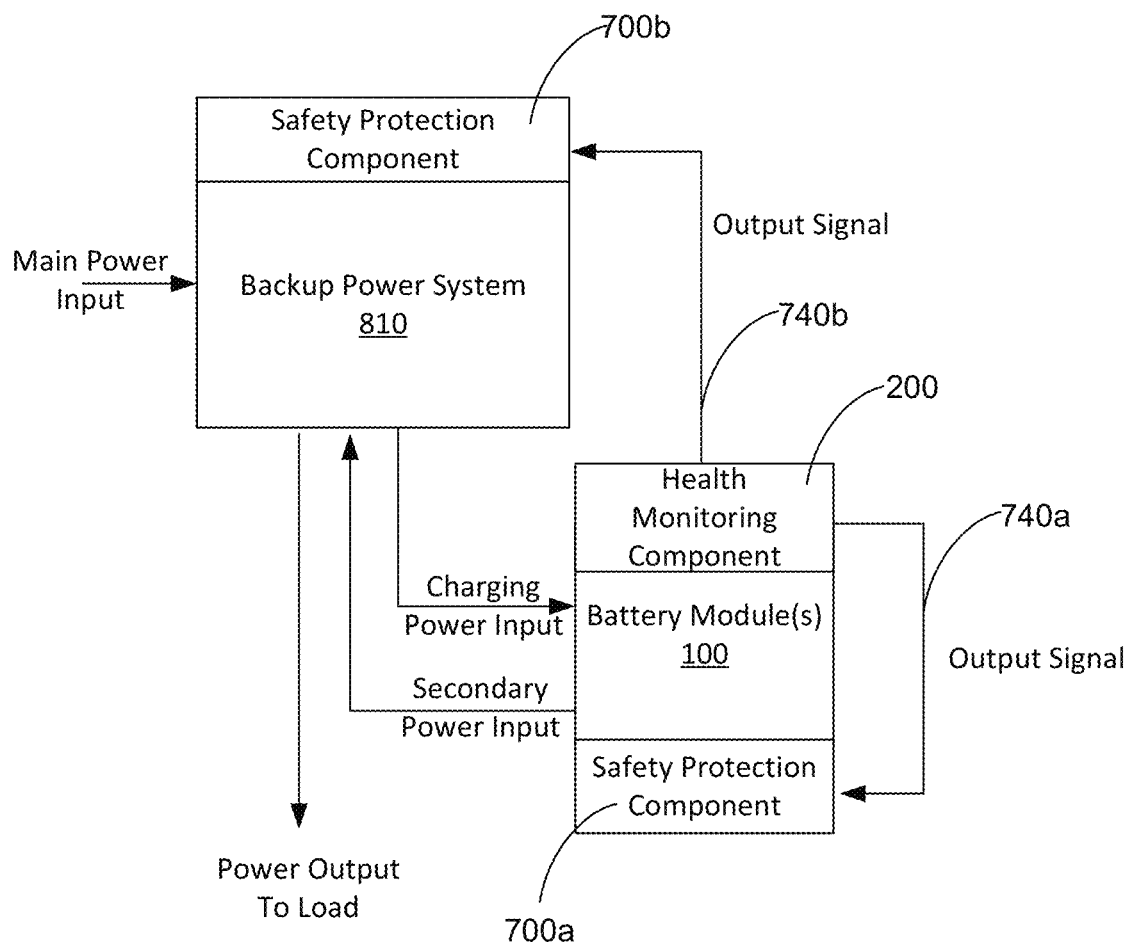
FIG. 8 is a block diagram of a backup power system that employs a lithium ion battery module having health monitoring and safety protection components in accordance with embodiments of the present disclosure.

Alternatively or in addition to the use of safety protection component 700a, 700b to disconnect the battery module 100 via relaying an output signal 740a (FIG. 8), some embodiments of the safety protection component 700b (FIG. 8) of the disclosed system initiates a shutdown of a backup power system 810 to which the battery module(s) 100 are connected as secondary batteries, as represented in FIG. 8. For example, an output signal 740b (FIG. 8) from the health monitoring component 200 may be relayed to an input of the backup power system 810, such as a UPS system, to trigger a shutdown of the backup power system 810. Accordingly, when the backup power system 810 is shutdown, no further degradation of a battery module 100 is expected due to the shutdown of charging power to the battery module 100. Otherwise, when the backup power system 810 is operational either main power from a primary power supply or secondary supplied from the backup power system 810 can be supplied to a load connected to the backup power system 810.

If the standard set for "state of health" is high (e.g. zero tolerance in cell expansion) of a backup power system 810, there may be no need to conduct electrical contact disconnection in either the battery module 100 or the backup power system 810. In this case, for some embodiments, the output signal 740 from the health monitoring component 200 may act as a notification of system checkup. Thus, a pure "state of health" monitoring system can be built based on the sensing of cell expansion and the resulting transmission of an output signal acting as an alarm or notification signal for a notification of violation of a healthy condition of the battery module 100 and need for system checkup. It is noted that exemplary forms of alarm include audible alarms, visible alarms, or any form of notifications using RS-232, RS-485, CAN protocols, etc. Accordingly, an alarm may be generated at the battery module itself 100 or externally at the backup power system 810.

It is contemplated for the purpose of preventing and minimizing the occurrence of system communication failure, redundant protection measures may be enacted in some embodiments, including electrical disconnections at both the battery module level and the backup power system level, in addition to physical terminal disconnections within the battery module 100, in accordance with embodiments of the present disclosure.

The above-described embodiments are examples of many possible implementations. Additional embodiments and implementations also include the following. For example, one embodiment, among others, of a safety apparatus for a lithium ion battery module 100 comprises a health monitoring component 200 configured to detect degradation of a battery cell 110 within the lithium ion battery module 100 and transmit an output signal. For example, the health monitoring component 200 may detect a change in shape or dimension of the battery cell. Such an apparatus further comprises a safety protection component 700 configured to receive the output signal and at least disable operation of the lithium ion battery module 100.

In various embodiments, the operation of the battery module 100 is disabled by physically disconnecting the battery cell 110 from a lid terminal T of the battery module 100. In some embodiments, the operation of the battery module 100 is disabled by electrically disconnecting the battery cell 110 from a lid terminal T of the battery module 100 by creating an open circuit in an electrical path between a terminal 720 of the battery cell 110 and the lid terminal T of the battery module. In one embodiment, among others, the operation of the battery module 100 may also be disabled by shutting down a backup power system 810 that supplies charging power to the battery module 100. In one additional embodiment, the backup power system 810 is an uninterruptible power supply system. In various embodiments, the safety protection component 700 further transmits a notification signal of a violation of a healthy condition of the battery module 100.

In one embodiment, among others, safety apparatus further includes a lithium ion battery module 100. Additionally, in some embodiments, the health monitoring component 200 comprises an infrared sensor 210 that is configured to detect displacement of the battery cell 110 from expansion of the battery cell during degradation. In one additional embodiment, the health monitoring component 200 comprises a pressure sensitive sensor 320 that is configured to detect a change in pressure within an enclosure 150 of the battery module 100 from expansion of the battery cell 110 during degradation. Further, in one embodiment, the health monitoring component 200 measures a force exerted on one or more terminals 410, 420 of the battery cell 110 from expansion of the battery cell 110 during degradation. Such a health monitoring component 200 may also comprise a voltage sensor 510 that is configured to detect a lost contact condition resulting from expansion of the battery cell 110 during degradation. Plus, in various embodiments, the battery cell 110 of such an apparatus comprises a Lithium Ferrous Phosphorous Oxide (LFPO) battery cell, a Lithium Iron Phosphate battery cell, a Lithium Nickel Manganese Cobalt battery cell, a Lithium Nickel Cobalt Aluminum battery cell, or a Lithium Cobalt Oxide battery cell.

In accordance with the present disclosure, one embodiment of a method of protecting a lithium ion battery module 100, among others, comprises detecting wherein a change in shape or dimension of a battery cell 110 within the lithium ion battery module 100 due to expansion of the battery cell 110; transmitting an output signal to a safety protection component 700; and disabling, via the safety protection component 700, operation of the lithium ion battery module 100. In some embodiments, the detection of degradation of the battery cell 110 comprises detecting displacement of the battery cell 110 across an infrared detection path. In one embodiment, among others, the detection of degradation of the battery cell 110 comprises detecting a change in pressure within an enclosure 150 of the battery module 100 from expansion of the battery cell 110.

Additionally, in one embodiment, the detection of degradation of the battery cell 110 comprises measuring a force exerted on one or more terminals 410, 420 of the battery cell 110 from expansion of the battery cell 110 during degradation and comparing the force against a threshold limit. Plus, in one embodiment, the detection of degradation of the battery cell 110 comprises detecting a lost contact condition resulting from expansion of the battery cell 110 during degradation. Further, in one embodiment, the disabling operation of the lithium ion battery module 100 comprises at least one of physically disconnecting the battery cell 110 from a lid terminal T of the battery module 100, electrically disconnecting the battery cell 110 from a lid terminal T of the battery module by creating an open circuit in an electrical path between a terminal 720 of the battery cell 110 and the lid terminal T of the battery module 100, or shutting down a backup power system 810 that supplies charging power to the battery module 100.

In various embodiments, among others, such a method further comprises transmitting a notification signal of a violation of a healthy condition of the battery module 100. Further, in some embodiments, the battery cell 110 comprises a Lithium Ferrous Phosphorous Oxide (LFPO) battery cell, a Lithium Iron Phosphate battery cell, a Lithium Nickel Manganese Cobalt battery cell, a Lithium Nickel Cobalt Aluminum battery cell, or a Lithium Cobalt Oxide battery cell.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the present disclosure. All such modifications and variations are intended to be included herein within the scope of this disclosure and protected by the following claims.

Therefore, at least the following is claimed:

1. A safety apparatus for a lithium ion battery module, the lithium ion battery module having a first terminal of a first battery cell and a second terminal of a second battery cell, the safety apparatus comprising:
   a cell terminal connector having at least one open end, wherein the open end of the cell terminal connector is connected to a first terminal of the first battery cell and an opposing end of the cell terminal connector is connected to the second terminal of the second battery cell or a lid terminal of the lithium ion battery module, wherein during an expansion of the first battery cell from cell degradation, the cell terminal connector is configured to create either an open circuit condition between the first battery cell and the second battery cell or between the first battery cell and the lid terminal by the open end of the cell terminal connector losing physical contact with the first terminal of the first battery cell;
   a health monitoring component configured to detect degradation of one of a plurality of battery cells within the lithium ion battery module and transmit an output signal, wherein the plurality of battery cells comprises at least the first battery cell and the second battery cell wherein the health monitoring component detects a change in shape or dimension of the one of the plurality of battery cells; and
   a safety protection component configured to receive the output signal and at least electrically disable operation of the lithium ion battery module and/or transmit a notification signal of a violation of a healthy condition of the battery module.

2. The safety apparatus of claim 1, wherein the cell terminal connector comprises a terminal cable that is configured to physically disconnecting first battery cell from the lid terminal of the battery module.

3. The safety apparatus of claim 1, wherein the operation of the battery module is electrically disabled by electrically disconnecting the one of the plurality of battery cells by creating an open circuit in an electrical path between a terminal of the battery cell and the lid terminal of the battery module.

4. The safety apparatus of claim 1, wherein the operation of the battery module is electrically disabled by shutting down a backup power system that supplies charging power to the battery module.

5. The safety apparatus of claim 4, wherein the backup power system is an uninterruptible power supply system.

6. The safety apparatus of claim 1, further comprising the lithium ion battery module.

7. The safety apparatus of claim 1, wherein the health monitoring component comprises an infrared sensor that is configured to detect displacement of the one of the plurality of battery cells from expansion of the battery cell during degradation.

8. The safety apparatus of claim 1, wherein the health monitoring component comprises a pressure sensitive sensor that is configured to detect a change in pressure within an enclosure of the battery module from expansion of the one of the plurality of battery cells during degradation.

9. The safety apparatus of claim 1, wherein the health monitoring component measures a force exerted on one or more terminals of the one of the plurality of battery cells from expansion of the battery cell during degradation.

10. The safety apparatus of claim 1, wherein the health monitoring component comprises a voltage sensor that is configured to detect a lost contact condition resulting from expansion of the one of the plurality of battery cells during degradation.

11. The safety apparatus of claim 1, wherein the one of the plurality of battery cells comprises a Lithium Ferrous Phosphorous Oxide (LFPO) battery cell, a Lithium Iron Phosphate battery cell, a Lithium Nickel Manganese Cobalt battery cell, a Lithium Nickel Cobalt Aluminum battery cell, or a Lithium Cobalt Oxide battery cell.

12. The safety apparatus of claim 1, wherein the cell terminal connector comprises a cell terminal collector plate connected in series between the first terminal of the first battery cell and the second terminal of the second battery cell, the open end of the cell terminal collector plate connected to the first battery cell and the opposing end of the cell terminal collector plate connected to the second terminal of the second battery cell.

13. A method of protecting a lithium ion battery module comprising:
    detecting a change in shape or dimension of a battery cell within the lithium ion battery module, wherein the detection of the change in shape or dimension of the battery cell comprises detecting displacement of the battery cell across an infrared detection path;
    transmitting an output signal to a safety protection component; and
    disabling, via the safety protection component, operation of the lithium ion battery module.

14. The method of claim 13, wherein the disabling operation of the lithium ion battery module comprises at least one of physically disconnecting the battery cell from a lid terminal of the battery module, electrically disconnecting the battery cell from a lid terminal of the battery module by creating an open circuit in an electrical path between a terminal of the battery cell and the lid terminal of the battery module, or shutting down a backup power system that supplies charging power to the battery module.

15. The method of claim 13, further comprising transmitting a notification signal of a violation of a healthy condition of the battery module.

16. The method of claim 13, wherein the battery cell comprises a Lithium Ferrous Phosphorous Oxide (LFPO) battery cell, a Lithium Iron Phosphate battery cell, a Lithium Nickel Manganese Cobalt battery cell, a Lithium Nickel Cobalt Aluminum battery cell, or a Lithium Cobalt Oxide battery cell.

17. A method of protecting a lithium ion battery module comprising:
    connecting a cell terminal collector plate in series between a first terminal of a first battery cell and a second terminal of a second battery cell, the cell terminal collector plate having an open end and closed end, the open end connected to the first terminal of the first battery cell and the closed end connected to the second terminal of the second battery cell connected, wherein the lithium ion battery module comprises at least the first battery cell and the second battery cell; and during an expansion of the first battery cell or the second battery cell from cell degradation, creating an open circuit condition between the first battery cell and the second battery cell by the open end of the cell terminal collector plate losing contact with the first terminal of the first battery cell.

18. The method of claim 17, further comprising:
    detecting the open circuit condition of the lithium ion battery module; and
    triggering an alarm indicating a problem with the lithium ion battery module responsive to detecting the open circuit condition.

19. A safety apparatus for a battery module comprising:
    a health monitoring component configured to detect degradation of a battery cell within the battery module and transmit an output signal, wherein the health monitoring component detects a change in shape or dimension of the battery cell; and
    a safety protection component configured to receive the output signal and at least disable operation of the battery module, wherein the operation of the battery module is disabled by shutting down a backup power system that supplies charging power to the battery module.

20. The safety apparatus of claim 19, wherein the operation of the battery module is further disabled by physically disconnecting the battery cell from a lid terminal of the battery module.

21. The safety apparatus of claim 19, wherein the health monitoring component comprises a pressure sensitive sensor that is configured to detect a change in pressure within an enclosure of the battery module from expansion of the battery cell during degradation or a voltage sensor that is configured to detect a lost contact condition resulting from expansion of the battery cell during degradation.

22. The safety apparatus of claim 19, wherein the health monitoring component measures a force exerted on one or more terminals of the battery cell from expansion of the battery cell during degradation.

23. A method of protecting a battery module comprising:
    detecting a change in shape or dimension of a battery cell within the battery module;
    transmitting an output signal to a safety protection component; and
    disabling, via the safety protection component, operation of the battery module, wherein the operation of the battery module is disabled by shutting down a backup power system that supplies charging power to the battery module.

24. The method of claim 23, wherein the detection of the change in shape or dimension of the battery cell comprises detecting a change in pressure within an enclosure of the battery module from expansion of the battery cell.

25. The method of claim 23, wherein the detection of the change in shape or dimension of the battery cell comprises measuring a force exerted on one or more terminals of the battery cell from expansion of the battery cell during degradation and comparing the force against a threshold limit.

26. The method of claim 23, wherein the detection of the change in shape or dimension of the battery cell comprises detecting a lost contact condition resulting from expansion of the battery cell during degradation.

* * * * *